(12) United States Patent
Lu et al.

(10) Patent No.: US 7,723,164 B2
(45) Date of Patent: May 25, 2010

(54) DUAL HEAT SPREADER PANEL ASSEMBLY METHOD FOR BUMPLESS DIE-ATTACH PACKAGES, PACKAGES CONTAINING SAME, AND SYSTEMS CONTAINING SAME

(75) Inventors: Daoqiang Lu, Chandler, AZ (US); Jiangqi He, Gilbert, AZ (US); Xiang Yin Zeng, Shanghai (CN); Jiamiao Tang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 498 days.

(21) Appl. No.: 11/469,581

(22) Filed: Sep. 1, 2006

(65) Prior Publication Data

US 2008/0054448 A1 Mar. 6, 2008

(51) Int. Cl.
*H01L 21/00* (2006.01)

(52) U.S. Cl. ............... 438/125; 257/707; 257/E23.101; 438/122

(58) Field of Classification Search .................. 438/125
See application file for complete search history.

(56) References Cited

U.S. PATENT DOCUMENTS 6,709,898 B1 * 3/2004 Ma et al. .................... 438/122

7,122,901 B2 * 10/2006 Sunohara et al. ............ 257/758

OTHER PUBLICATIONS

Tang, Jiamiao, et al., "Dual Die Package with High-Speed Interconnect", U.S. Appl. No. 11/321,195, filed Dec. 29, 2005.

* cited by examiner

*Primary Examiner*—Thao X Le
*Assistant Examiner*—Ajay K Arora
(74) *Attorney, Agent, or Firm*—John N. Greaves

(57) ABSTRACT

A process includes mating a first heat spreader and a second heat spreader, such that the first heat spreader at a mating surface and second heat spreader at a mating surface become parallel and adjacent. The process includes placing a first die in a first die recess of the first heat spreader, and placing a second die in a second die recess in the second heat spreader. The process includes reflowing thermal interface material between each die and respective heat spreader. Thereafter, the process includes separating the first heat spreader and the second heat spreader. A package is achieved by the process, with reduced thicknesses. The package can be disposed onto a mounting substrate. The package can be assembled into a computing system.

23 Claims, 8 Drawing Sheets

DUAL HEAT SPREADER PANEL ASSEMBLY METHOD FOR BUMPLESS DIE-ATTACH PACKAGES, PACKAGES CONTAINING SAME, AND SYSTEMS CONTAINING SAME

TECHNICAL FIELD

Embodiments relate generally to a chip-level integration of devices.

TECHNICAL BACKGROUND

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a process for forming a die in a heat spreader recess. Embodiments also relate to methods of assembling a bumpless build-up layer after forming a die in a heat spreader recess.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die. A heat spreader in this disclosure is a thin structure that is dual-die-and-dual-heat spreader processed.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

Figure 1A:
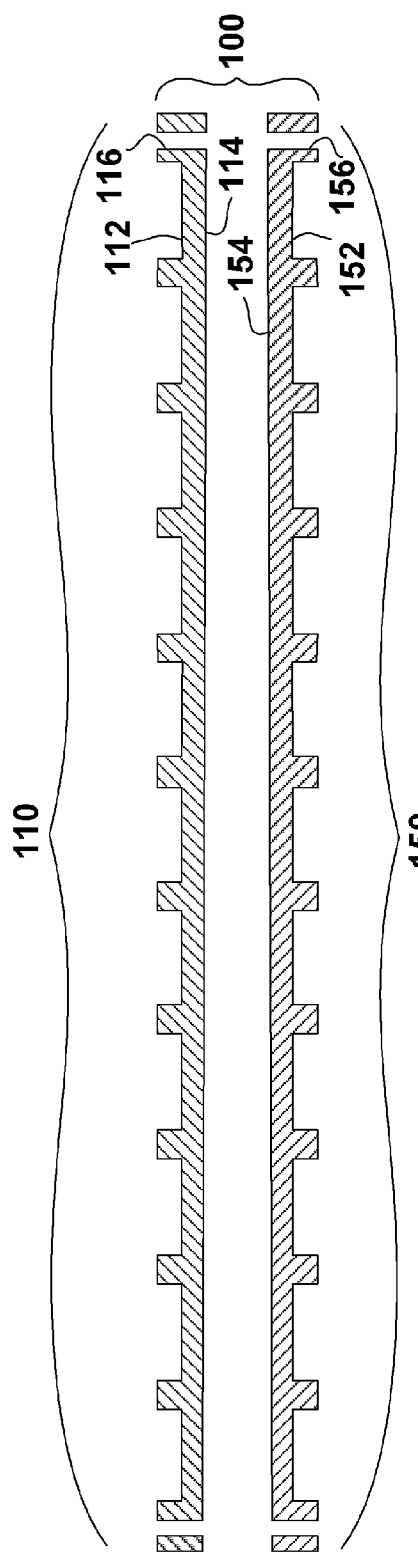
FIG. 1A is an elevational cross section that illustrates a mating processes for a heat spreader and die according to an embodiment.

FIG. 1A is an elevational cross section that illustrates a mating processes for a heat spreader and die according to an embodiment. A first heat spreader 110 and a second heat spreader 150 are part of an assembly 100 according to an embodiment. In a process embodiment, mating of the first heat spreader 110 and the second heat spreader 150 is carried out. The first heat spreader includes a first die recess 112, a first heat spreader mating surface 114, and a first heat spreader fastening corridor 116. The first heat spreader mating surface 114 can also be referred to as a first heat spreader heat sink side 114. The second heat spreader 150 includes a second die recess 152, a second heat spreader mating surface 154, and a second heat spreader fastening corridor 156. The second heat spreader mating surface 154 can also be referred to as a second heat spreader heat sink side 154. As depicted in FIG. 1A the first heat spreader mating surface 114 and second heat spreader mating surface 154 become parallel and adjacent during the process of mating.

In an embodiment, the first heat spreader 110 and second heat spreader 150 are each formed by stamping a blank with a stamping die that forms the die recesses 112 and 152. The first heat spreader fastening corridor 116 and the second heat spreader fastening corridor 156 are processed by drilling such as by holding both the first heat spreader 110 and second heat spreader 150 in a jig and drilling both fastening corridors 116 and 156 simultaneously, such that, e.g., after drilling out the first heat spreader fastening corridor 116, drilling continues to drill by self-aligning therethrough to drill out the second heat spreader fastening corridor 156. In an embodiment, the first heat spreader 110 and second heat spreader 150 are formed by machining each from a blank. Drilling out the first heat spreader fastening corridor 116 and the second heat spreader fastening corridor 156 is accomplished by, e.g., the self-aligning drilling set forth in this disclosure.

Figure 1B:
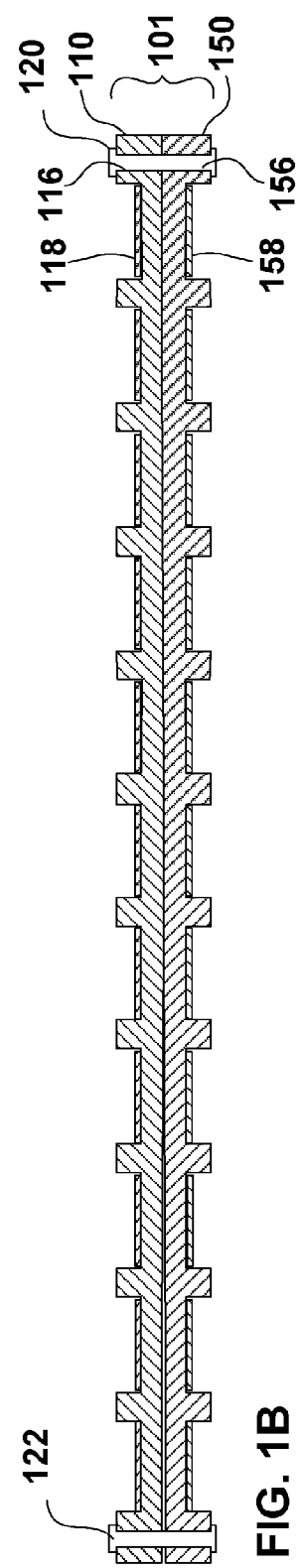
FIG. 1B is an elevational cross section that further illustrates the mating processes depicted in FIG. 1A according to an embodiment.

FIG. 1B is an elevational cross section that further illustrates the mating processes depicted in FIG. 1A according to an embodiment. The assembly 101 is illustrated after a first heat-spreader fastener 120 has been inserted into the first heat spreader fastening corridor 116 and the second heat spreader fastening corridor 156. A second heat-spreader fastener 122 is inserted into heat a spreader fastening corridor at the other end of the assembly 101. Consequently, the first heat spreader mating surface 114 (FIG. 1A) and the second heat spreader mating surface 154 (FIG. 1A) are mated to become parallel and adjacent. Further, no adhesive is used at the first heat spreader mating surface 114 and the second heat spreader mating surface 154 according to an embodiment. Rather, mating is accomplished, parallel and adjacent, by use of the heat-spreader fasteners 120 and 122. Mating is sufficiently close, however, that thermal events are heat-transfer conducted between the first heat spreader mating surface 114 and the second heat spreader mating surface 154 during processing.

In an embodiment, no fasteners are used, rather, the first heat spreader 110 and the second heat spreader 150 are clamped together with a clamping jig, e.g., a C-clamp, and held together during further processing until separating the first heat spreader 110 and the second heat spreader 150.

FIG. 1B also illustrates the placing of a first thermal interface material (TIM) 118 and a second TIM 158 into the respective first and second die recesses 112 and 152. A plurality of first TIMs and second TIMs is illustrated, as is a corresponding plurality of die recesses, but reference to a first TIM 118 and a second TIM 158 is given for simplicity.

In an embodiment, the first and second TIMs 118 and 158 are each stamped into their respective first and second die recesses 112 and 152 during stamping formation of the respective first and second heat spreaders 110 and 150. In an embodiment, stamping of the respective first and second TIMs 118 and 158 is accomplished after stamping formation of their respective first and second heat spreaders 110 and 150. In an embodiment, placing of the first and second TIMs 118 and 158 in their respective first and second die recesses 112 and 152 is done without stamping, but with a heat-fugitive adhesive or flux that tacks the first and second TIMs 118 and 158 in their respective first and second die recesses 112 and 152 before further processing.

Figure 1C:
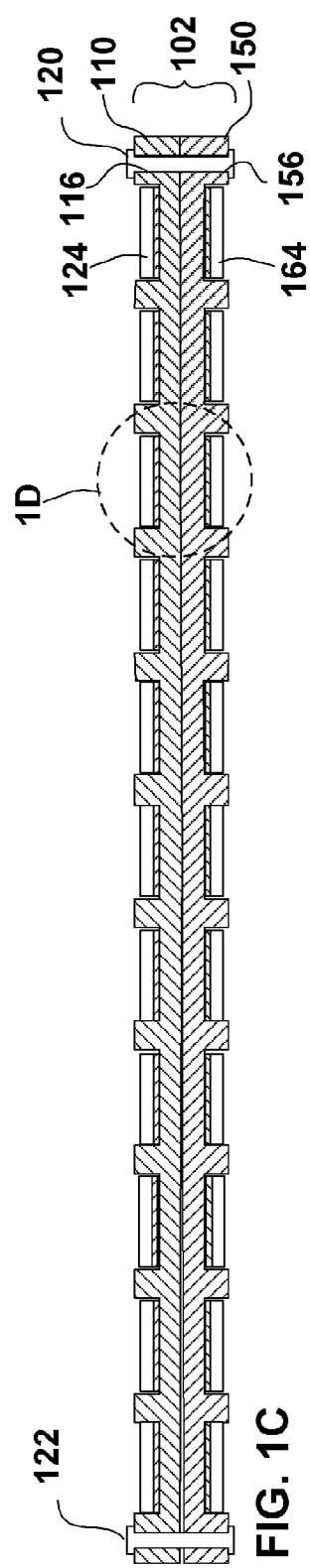
FIG. 1C is an elevational cross section that further illustrates processing depicted in FIG. 1B according to an embodiment.

FIG. 1C is an elevational cross section that further illustrates processing depicted in FIG. 1B according to an embodiment. The assembly 102 is illustrated after a first die 124 and a second die 164 are placed in the respective first and second die recesses 112 and 152. A plurality of first dice and second dice is illustrated, as is a corresponding plurality of die recesses, but reference to a first die 124 and a second die 164 is given for simplicity.

During processing in FIG. 1C, reflowing of the first TIM 118 and the second TIM 158 is done, such that the first die 124 becomes affixed in the first die recess 112 (FIG. 1A) and the second die 164 becomes affixed in the second die recess 152 (FIG. 1A). During reflowing, which can also be referred to as thermal processing of the assembly 102, thermal stresses in the first die 124, the first TIM 118, and the first heat spreader 110 are substantially counteracted by thermal stresses in the second die 164, the second TIM 158, and the second heat spreader 150. For example, where a tendency for concave bowing of the first heat spreader 110 is present during thermal processing, a similar tendency for concave bowing of the second heat spreader 150 causes a substantial counteractive force upon the first heat spreader 110.

Figure 1D:
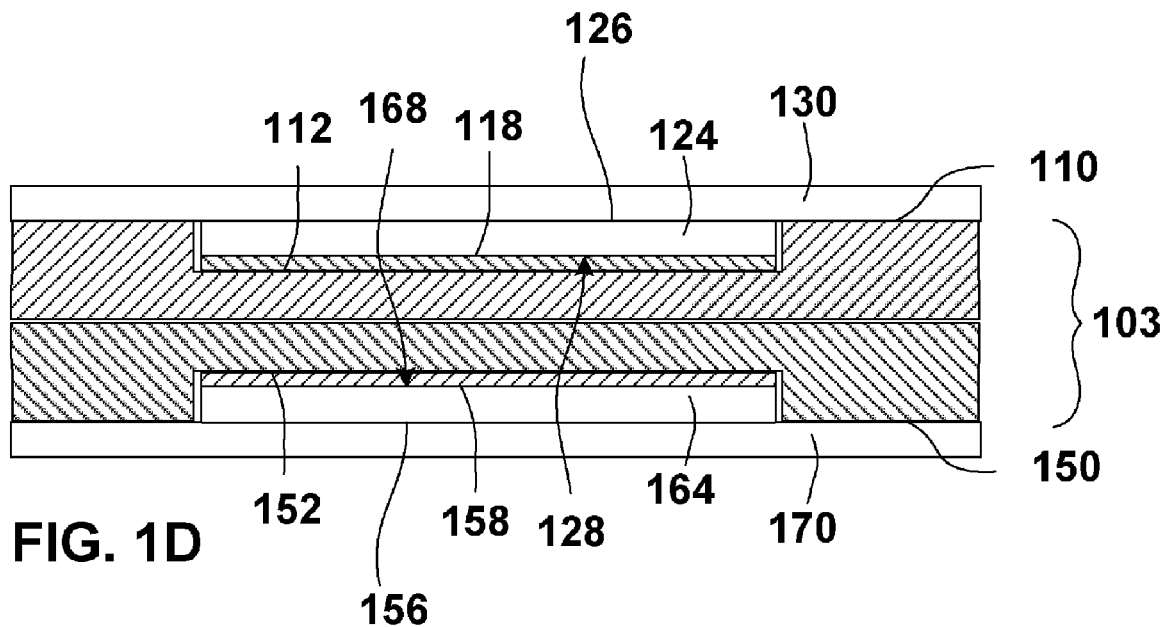
FIG. 1D is a detail elevational cross section that further illustrates processing depicted in FIG. 1C according to an embodiment.

FIG. 1D is a detail elevational cross section that further illustrates processing depicted in FIG. 1C according to an embodiment. The detail elevational cross section in FIG. 1C is taken at the dashed line 1D, but further processing has been accomplished. The first die 124 includes a first die active surface 126 and a first die backside surface 128. The second die 164 includes second first die active surface 166 and a second die backside surface 168. During processing, placing the first die 124 includes reflowing the first TIM 118 between the first heat spreader first die recess 112 (FIG. 1A) and the first die backside surface 128. Processing simultaneously includes reflowing the second TIM 158 between the second heat spreader second die recess 152 (FIG. 1A) and the second die backside surface 168. According to an embodiment, reflowing the first TIM 118 and the second TIM 158 cause respective first and second thermal stresses that substantially counteract.

In FIG. 1D, a first jig 130 holds the first die 124 and the first TIM 118 in the first die recess 112, and a second jig 170 holds the second die 164 and the second TIM 158 in the second die recess 152. In this embodiment, the jigs allow the TIMs to be reflowed, without stamping the TIMs, or after stamping the TIMs, to hold the dice in place.

Figure 1E:
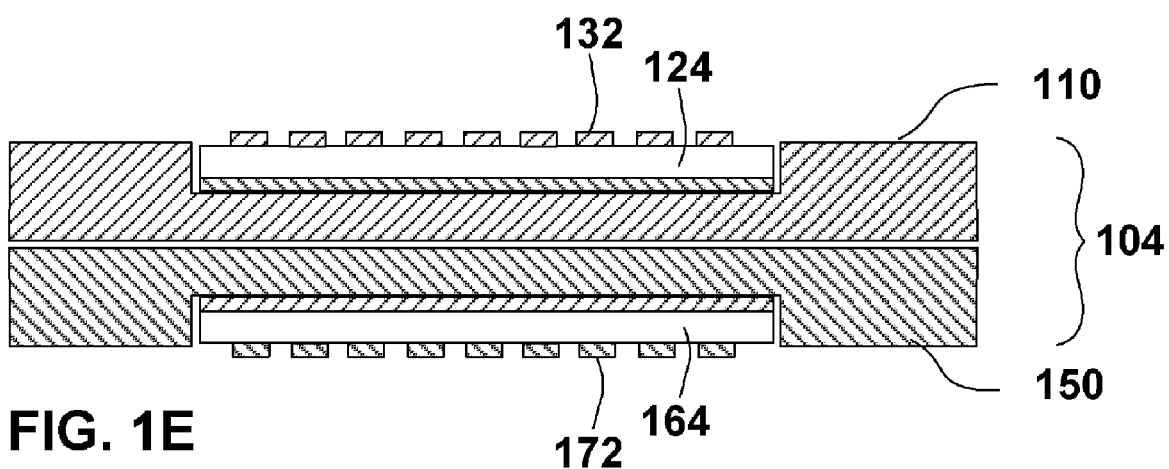
FIG. 1E is a detail elevational cross section that further illustrates processing depicted in FIG. 1D according to an embodiment.

FIG. 1E is a detail elevational cross section that further illustrates processing depicted in FIG. 1D according to an embodiment. The detail elevational cross section 104 in FIG. 1E is taken at the dashed line 1D, but further processing has been accomplished. The assembly 104 illustrates the beginning of forming a bumpless build-up layer (BBUL) on the dice. In FIG. 1E, electrical bumps or pads 132 and 172 are formed on the respective first and second die 124 and 164.

Figure 1F:
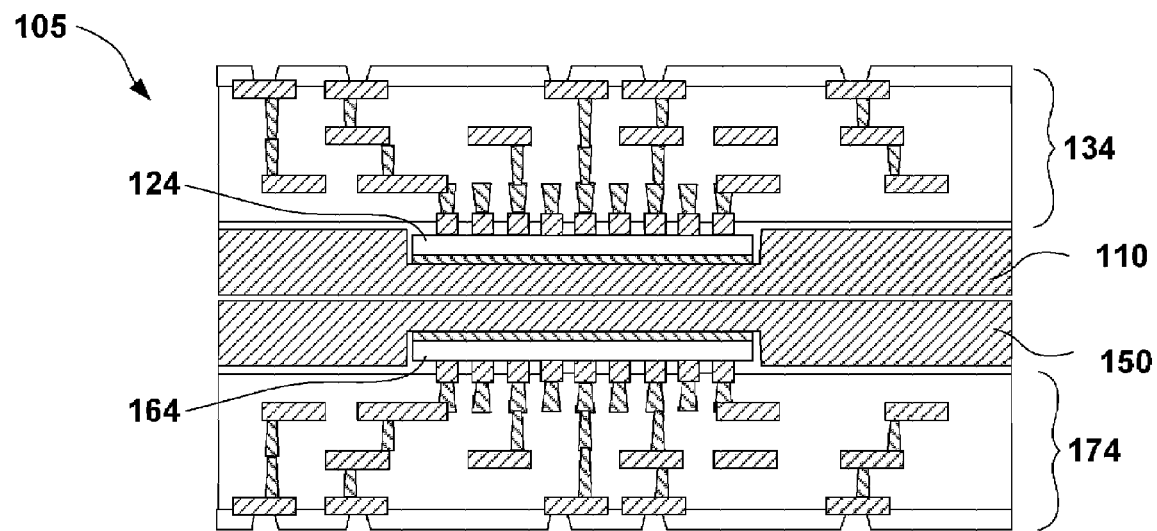
FIG. 1F is a detail elevational cross section that further illustrates processing depicted in FIG. 1E according to an embodiment.

FIG. 1F is a detail elevational cross section that further illustrates processing depicted in FIG. 1E according to an embodiment. The detail elevational cross section in FIG. 1F is taken at the dashed line 1C, but further processing has been accomplished. The assembly 105 illustrates the formation of a first BBUL metallization 134 on the first die 124, as well as on the first heat spreader 110 according to an embodiment. The assembly 105 also illustrates the formation of a second BBUL metallization 174 on the second die 164, as well as on the second heat spreader 150 according to an embodiment.

Figure 2:
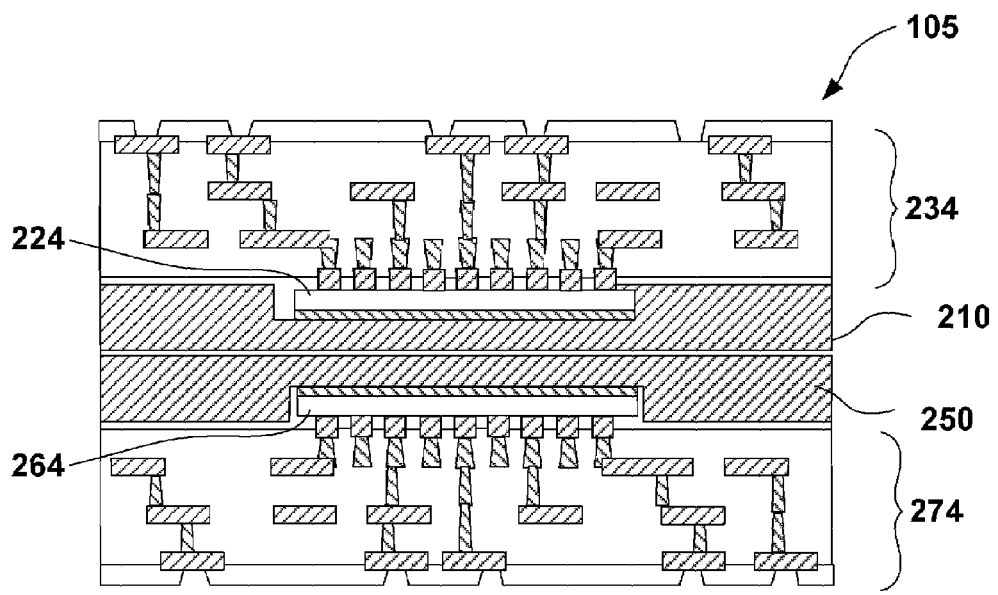
FIG. 2 is a detail elevational cross section that further illustrates processing depicted in FIG. 1E according to an embodiment.

FIG. 2 is an elevational cross section FIG. of an assembly according to an embodiment. The assembly 200 illustrates the formation of a first BBUL metallization 234 on a first die 224, as well as on a first heat spreader 210 according to an embodiment. The assembly 200 also illustrates the formation of a second BBUL metallization 274 on a second die 264, as well as on a second heat spreader 250 according to an embodiment.

In contrast to the BBUL metallizations 134 and 174 depicted in FIG. 1F, the BBUL metallizations 234 and 274 are dissimilar. In an embodiment, the recesses are not aligned between the first heat spreader 210 and the second heat spreader 250. In an embodiment, the two BBUL metallizations 234 and 274 are not mirror images of each other.

Figure 3:
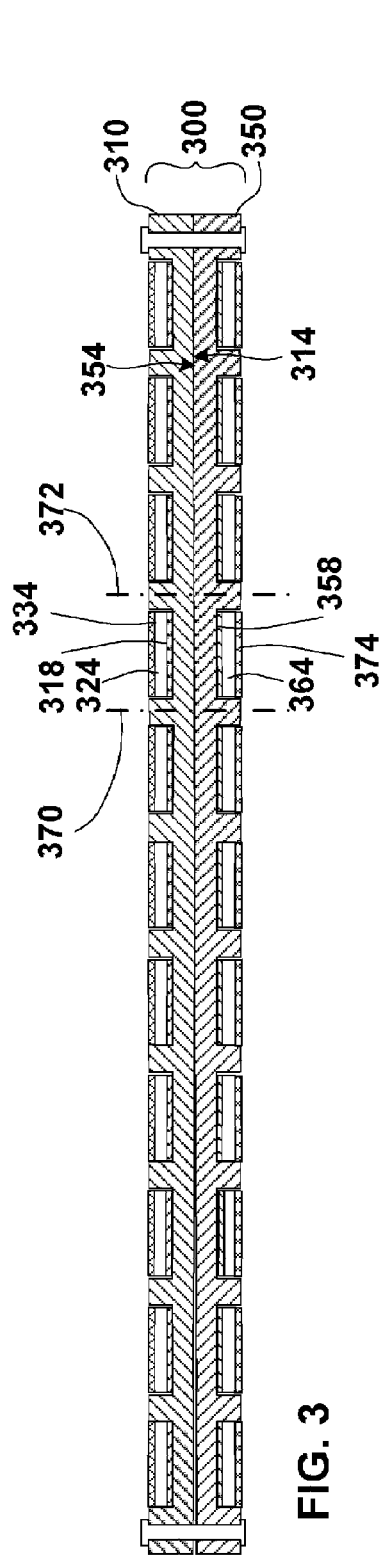
FIG. 3 is an elevational cross-section of a die-footprint-hidden radio-frequency passive-device layer that is in the substrate of a chip package according to an embodiment.

FIG. 3 is an elevational cross section of an assembly according to an embodiment. A first heat spreader 310 and a second heat spreader 350 are part of an assembly 300 according to an embodiment. The first heat spreader 310 includes a first heat spreader mating surface 314. The second heat spreader 350 includes a second heat spreader mating surface 354. As depicted, the first heat spreader mating surface 314 and second heat spreader mating surface 354 are parallel and adjacent during the process of mating.

FIG. 3 also illustrates the placing of a first TIM 318 and a second TIM 358 as well as a first die 324 and a second die 364. Further, a first BBUL 334 and a second BBUL 374 are depicted. In this embodiment, the first BBUL 334 and the second BBUL 374 do not encroach onto the respective first and second heat spreaders 310 and 350; rather, they remain entirely upon their respective first and second die 324 and 364. In an embodiment, the first BBUL and the second BBUL encroach onto the respective first and second heat spreaders as depicted in FIGS. 1, 2 and 4.

Processing is depicted at two incision lines 370, 372. Cutting the assembly 300 is carried out to singulate the first die 324 from the second die 364, but they remain a unit until singulation is complete.

Figure 4:
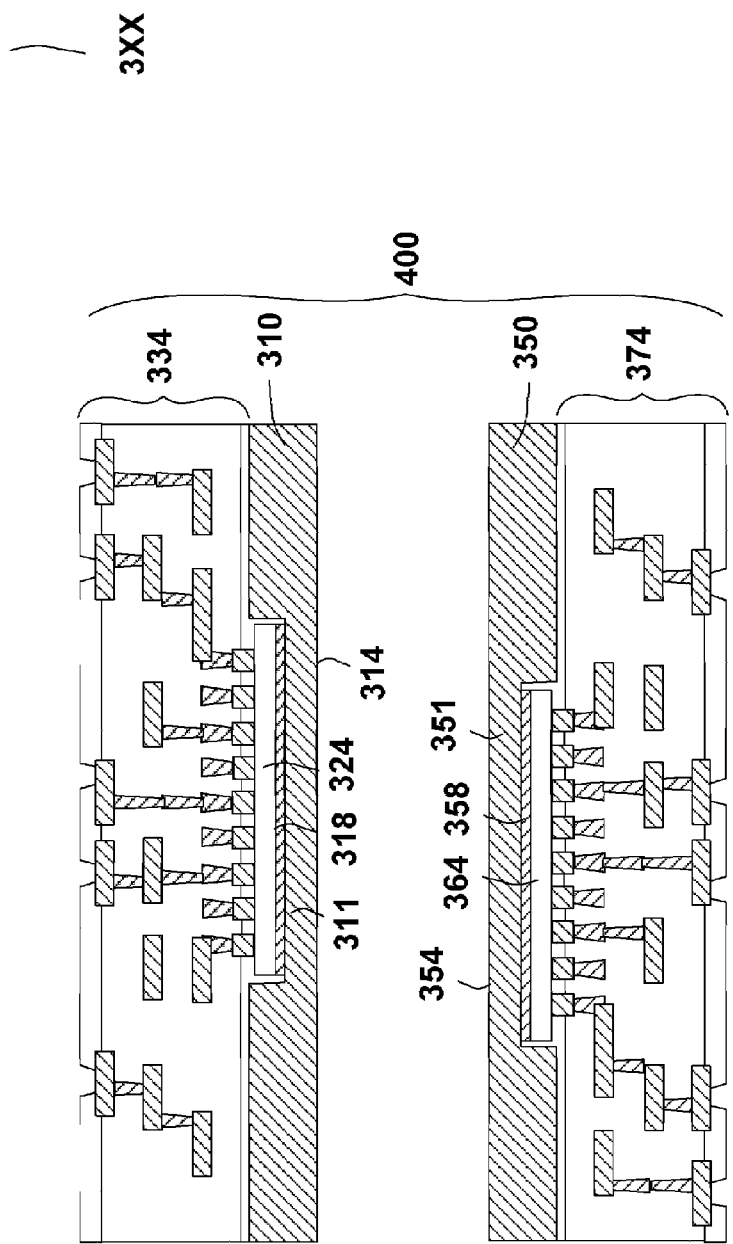
FIG. 4 is an elevational cross section that illustrates a separating process for a heat spreader and die according to an embodiment.

FIG. 4 is an elevational cross section that illustrates a separating process for a heat spreader and die according to an embodiment. After the singulating process depicted in FIG. 3, the first heat spreader 310 has been singulated to form a first singulated heat spreader 311 with the first heat spreader mating surface 314, and the first die 324 bonded to the first singulated heat spreader 311 through the first TIM 318. A first BBUL 334 is disposed upon the first die 324 and also upon the first singulated heat spreader 311. Similarly, a second singulated heat spreader 351 with the second heat spreader mating surface 354 is formed, and the second die 364 is bonded to the second singulated heat spreader 351 through the second TIM 358. And a second BBUL 374 is disposed upon the second die 364 and also upon the second singulated heat spreader 351. FIG. 4 also depicts the first singulated heat spreader 311 and the second singulated heat spreader 351 coming apart at the first heat spreader mating surface 314 and the second heat spreader mating surface 354.

In FIG. 4, the die 324 has a thickness in a range from about 25 micrometer (μm) to about 1 millimeter. The TIM 318 disposed between the die 324 and the heat spreader 310 has a thickness in a range from about 5 μm to about 200 μm. Further, the heat spreader 310 has a thickness between the bottom of the die recess and the heat sink side 314, in a range from about 200 μm to about 10 millimeter. In an embodiment, the die 324 has a thickness of about 100 μm, the TIM 318 has a thickness of about 25 μm, and the heat spreader 310 has a thickness of about 2 millimeter. Such minute thicknesses are achievable without significant processing loss by eliminating otherwise problematic thermal stresses, according to the processing embodiments set forth in this disclosure.

Figure 5:
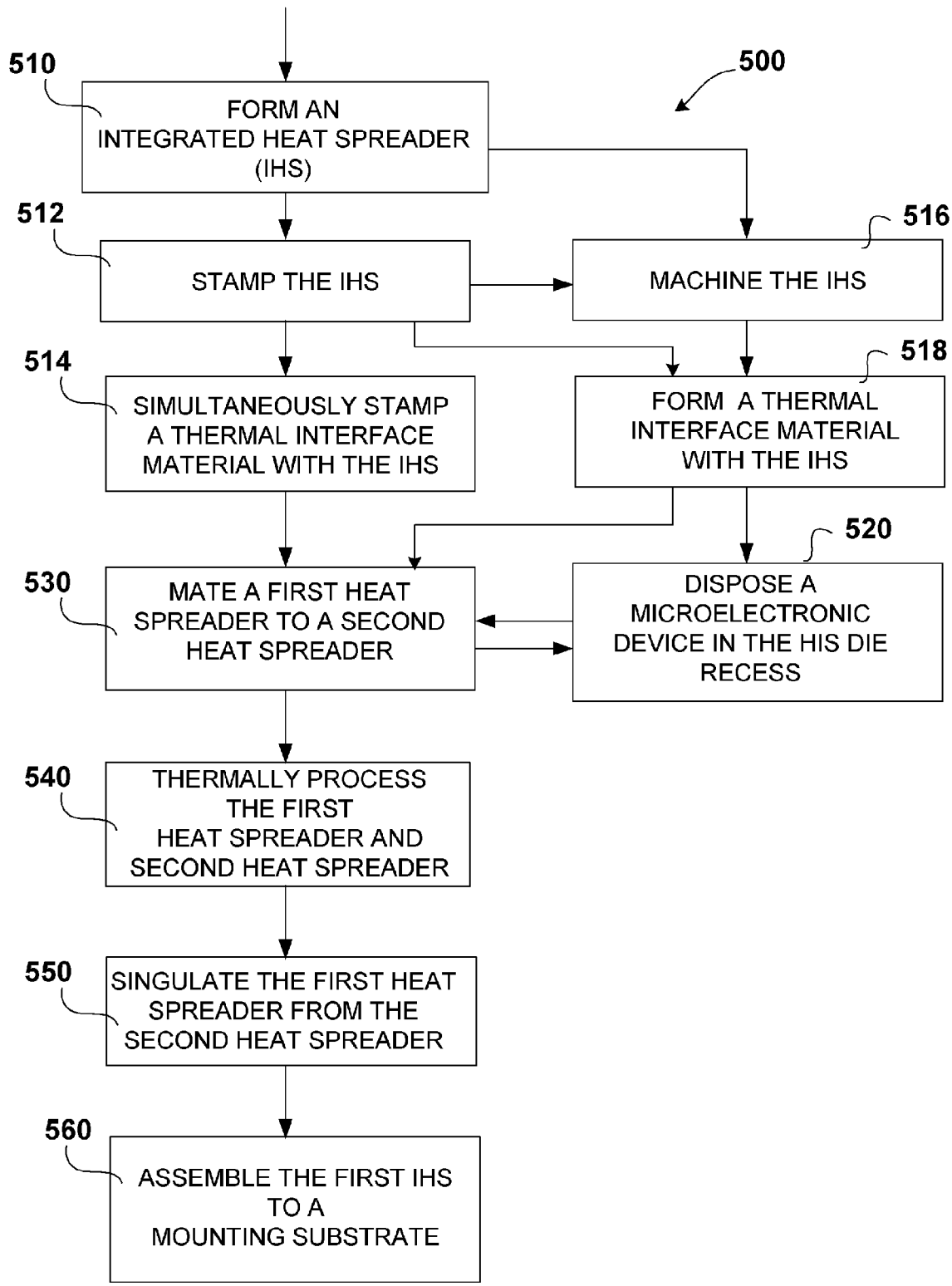
FIG. 5 is a flow chart that describes method flow embodiments.

FIG. 5 is a flow chart 500 that describes method flow embodiments.

At 510, the method includes forming an integrated heat spreader (IHS).

At 512, the process includes stamping the first heat spreader. Stamping is used to form the die recess.

At 514, the process includes simultaneously stamping a TIM into the first heat spreader. In an embodiment, a TIM is placed upon a heat spreader blank sheet and stamping is targeted to locate the TIM into a die recess during the stamping process.

At 516, the process includes machining the heat spreader. This is an embodiment instead of stamping. In an embodiment, however, stamping is followed by machining finishing as depicted flowing from 512 to 516.

At 518, the machining process is followed by placing a TIM in the die recess.

At 520, the process includes disposing a microelectronic die in the IHS die recess.

At 530, the process includes mating the IHS to a second IHS. In an embodiment, the process at 520 follows mating the two integrated heat spreaders.

At 540, the process includes thermally processing the first heat spreader and the second heat spreader. In this process, the TIM, the IHS, and the die are bonded by reflowing the TIM.

At 550, the process includes singulating the first heat spreader and the second heat spreader. Singulating follows thermal processing because the thermal stresses in the back-to-back heat spreaders are used to effectively neutralize each other, particularly warping and bowing during thermal processing, and particularly with the die, IHS, and TIM thicknesses that are herein disclosed, and that can be used with the process embodiments.

At 560, the process includes a method of assembling the first IHS (meaning attaching an assembly embodiment) to a mounting substrate. This process embodiment includes after singulating, assembling a die package, including a die, IHS, and TIM that were manufactured according to the various embodiments herein disclosed.

Figure 6:
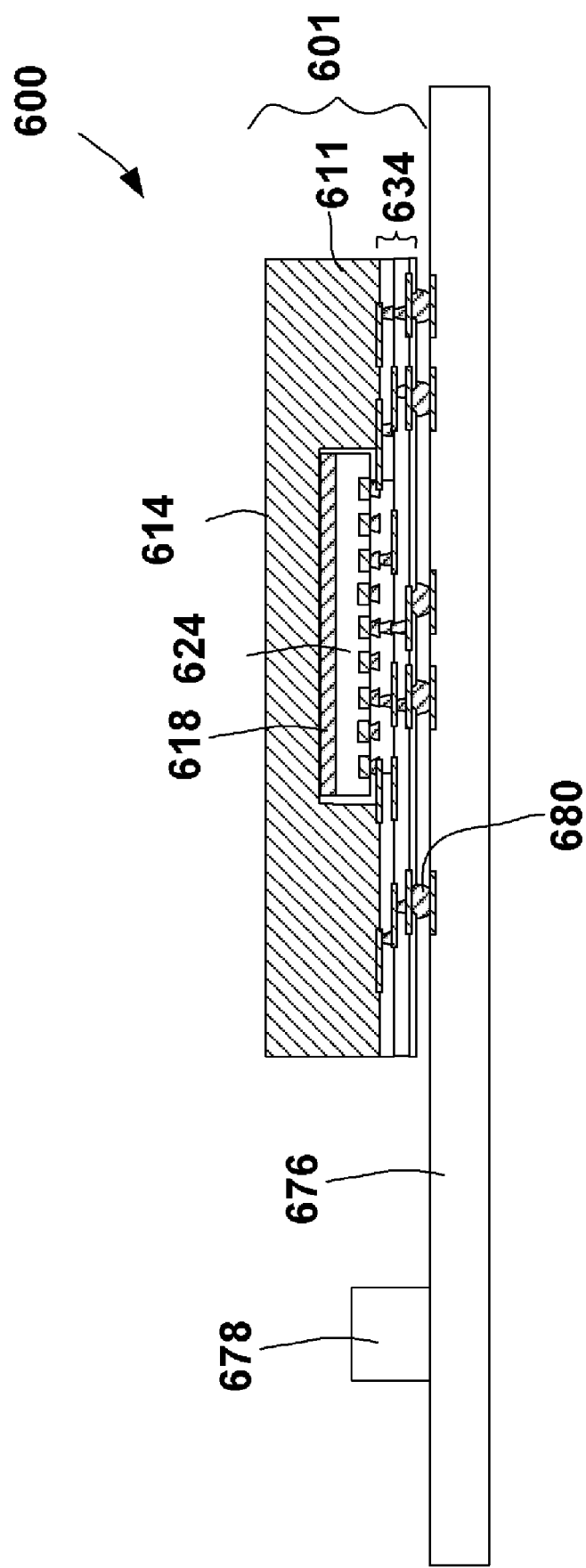
FIG. 6 is an elevation cross section of a package that contains an assembly according to an embodiment

FIG. 6 is an elevation cross section of a package 600 that contains an assembly 601 according to an embodiment. A first singulated heat spreader 611 with a first heat spreader mating surface 614 and a first die 624, are bonded to the first singulated heat spreader 611 through a first TIM 618. A first BBUL 634 is disposed upon the first die 624 and also upon the first singulated heat spreader 611.

The assembly 601 is disposed upon a mounting substrate 676, and is coupled thereto through at least one electrical bump 680. The mounting substrate 676 also shows a component 678 mounted thereon. A method embodiment includes attaching the assembly 601 to the mounting substrate 676 In an embodiment, the assembly 601 is referred to as a BBUL chip package.

Figure 7:
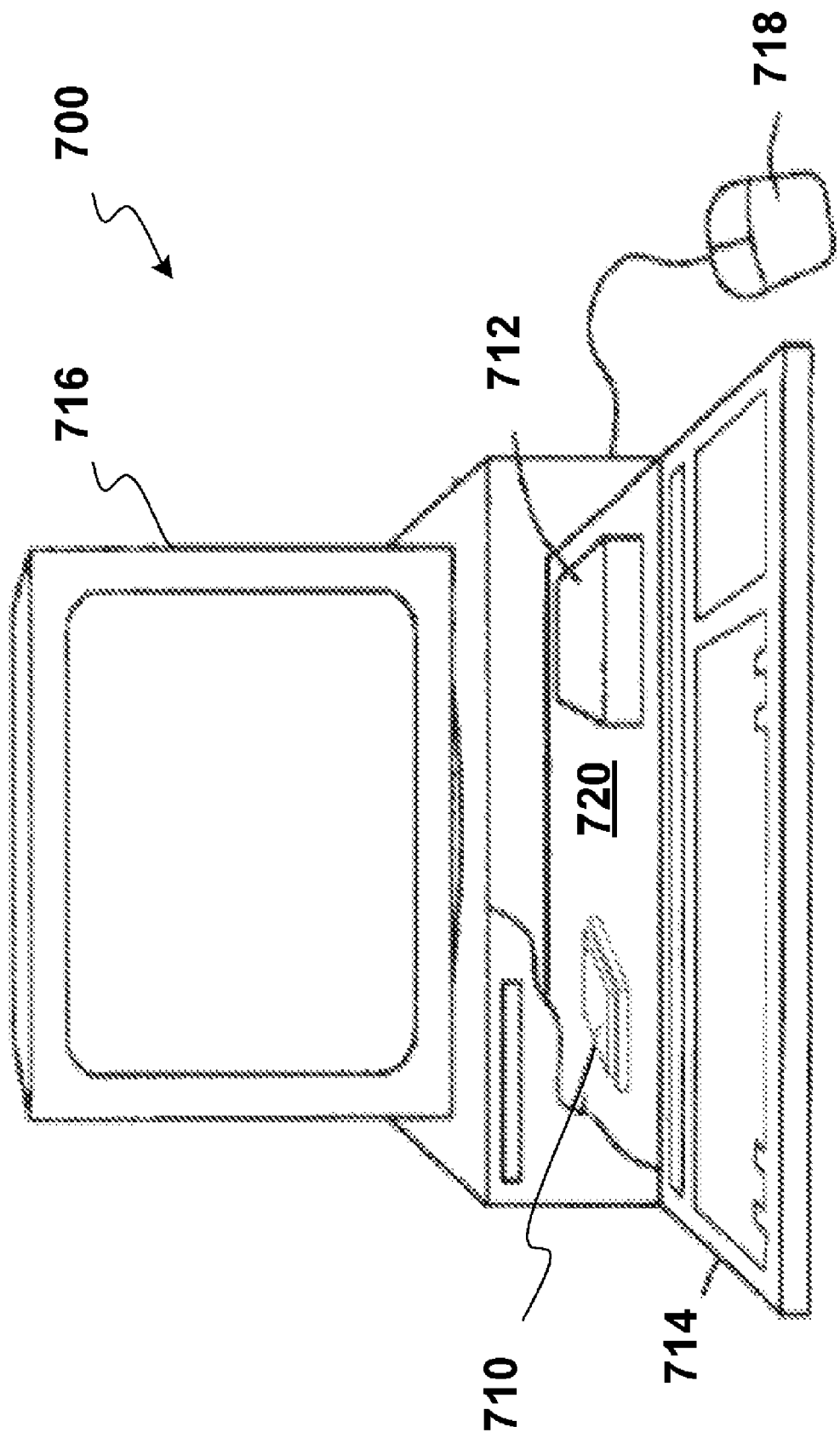
FIG. 7 is a cut-away perspective that depicts a computing system according to an embodiment.

FIG. 7 is a cut-away perspective that depicts a computing system 700 according to an embodiment. One or more of the foregoing embodiments of the BBUL chip packages manufactured according to a process embodiment may be utilized in a computing system, such as a computing system 700 of FIG. 7. Hereinafter any BBUL chip packages manufactured according to a process embodiment alone or in combination with any other embodiment is referred to as an embodiment(s) configuration.

The computing system 700 includes at least one processor (not pictured), which is enclosed in an IC chip package 710, a data storage system 712, at least one input device such as a keyboard 714, and at least one output device such as a monitor 716, for example. The computing system 700 includes a processor that processes data signals, and may include, for example, a microprocessor, available from Intel Corporation. In addition to the keyboard 714, the computing system 700 can include another user input device such as a mouse 718, for example. The computing system 700 can include a structure, after processing as depicted in FIGS. 2, 3, 4, and 6 of a given BBUL chip package manufactured according to a process embodiment.

For purposes of this disclosure, a computing system 700 embodying components in accordance with the claimed subject matter may include any system that utilizes a microelectronic device system, which may include, for example, at least one of the BBUL chip packages manufactured according to a process embodiment that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM (eDRAM) cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 712.

In an embodiment, the computing system 700 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on a board 720. In this embodiment, an embodiment(s) configuration is coupled to the DSP, and a separate embodiment(s) configuration may be present that is coupled to the processor in the IC chip package 710. Additionally in an embodiment, an embodiment(s) configuration is coupled to a DSP that is mounted on the same board 720 as the IC chip package 710. It can now be appreciated that the embodiment(s) configuration can be combined as set forth with respect to the computing system 700, in combination with an embodiment(s) configuration as set forth by the various embodiments of the BBUL chip packages manufactured according to a process embodiment within this disclosure and its equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

Figure 8:
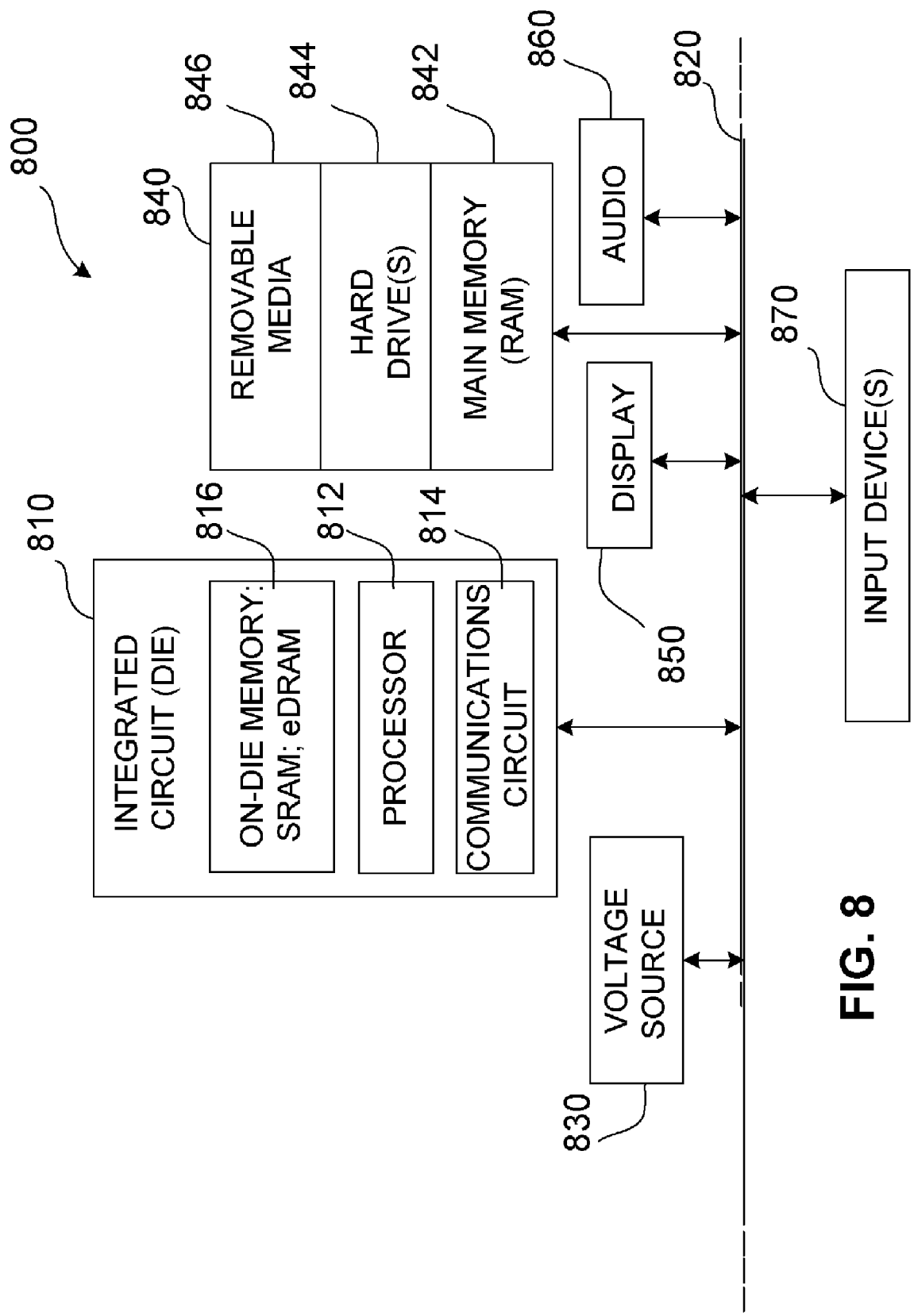
FIG. 8 is a schematic of a computing system according to an embodiment.

FIG. 8 is a schematic of an electronic system 800 according to an embodiment. The electronic system 800 as depicted can embody the computing system 700 depicted in FIG. 7, but the electronic system is depicted more schematically. The electronic system 800 incorporates at least one electronic assembly 810, such as an IC die illustrated in FIGS. 2-4 and 6. In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 means any type of circuit such as, but not limited to, a microprocessor, a micro-controller, a graphics processor, a digital signal processor, or another processor. Other types of circuits that can be included in the integrated circuit 810 are a custom circuit or an ASIC, such as a communications circuit 814 for use in wireless devices such as cellular telephones, pagers, portable computers, two-way radios, and similar electronic systems. In an embodiment, the processor 810 includes on-die memory 816 such as SRAM. In an embodiment, the processor 810 includes on-die memory 816 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital video disks (DVDs), flash memory, and other removable media known in the art.

In an embodiment, the electronic system 800 also includes a display device 850 and an audio output 860. In an embodiment, the electronic system 800 includes an input 870, such as a keyboard, mouse, trackball, game controller, microphone, voice-recognition receiver, or any other device that inputs information into the electronic system 800.

As shown herein, integrated circuit 810 can be implemented in a number of different embodiments, including an electronic package, an electronic system, a computer system, one or more methods of fabricating an integrated circuit, and one or more methods of fabricating an electronic assembly that includes the integrated circuit and the BBUL chip package as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of this invention may be made without departing from the principles and scope of the invention as expressed in the subjoined claims.

What is claimed is:

1. A method comprising:
   mating a first heat spreader and a second heat spreader, wherein the first heat spreader includes a first die recess and a first heat spreader mating surface, and wherein the second heat spreader includes a second die recess and a second heat spreader surface, and such that the first heat spreader mating surface and second heat spreader mating surface become parallel and adjacent;
   thermal processing the first heat spreader and the second heat spreader; and thereafter
   separating the first heat spreader from the second heat spreader.

2. The method of claim 1, before separating the first heat spreader and the second heat spreader, the process further including:
   placing a first die in the first die recess; and
   placing a second die in the second die recess.

3. The method of claim 2, wherein the first die includes a first die active surface and a first die backside surface, wherein placing the first die includes reflowing a first thermal interface material (TIM) between the first heat spreader first die recess and the first die backside surface.

4. The method of claim 2, wherein the first die includes a first die active surface and a first die backside surface, wherein the second die includes a second die active surface and a second die backside surface, wherein placing the first die includes:

reflowing a first thermal interface material (TIM) between the first heat spreader first die recess and the first die backside surface, and wherein placing the second die includes:
reflowing a second TIM between the second heat spreader second die recess and the second die backside surface; and
wherein reflowing the first TIM and the second TIM cause respective first thermal stresses and second thermal stresses that substantially counteract each other.

5. The method of claim 1, further including:
forming the first heat spreader by stamping an array that includes the first die recess on a die side thereof and the first heat spreader mating surface on a heat sink side thereof.

6. The method of claim 1, further including:
forming the first heat spreader by stamping an array that includes the first die recess on a die side thereof and the first heat spreader mating surface on a heat sink side thereof, and wherein stamping includes stamping a thermal interface material (TIM), under conditions that results in the TIM being disposed in the first die recess.

7. The method of claim 1, further including:
forming the first heat spreader by stamping an array that includes the first die recess on a die side thereof and the first heat spreader mating surface on a heat sink side thereof; and
forming the second heat spreader by stamping an array that includes the second die recess on a die side thereof and the second heat spreader mating surface on a heat sink side thereof.

8. The method of claim 1, further including:
forming the first heat spreader by machining an array that includes the first die recess on a die side thereof and the first heat spreader mating surface on a heat sink side thereof.

9. The method of claim 1, wherein mating includes fastening the first heat spreader to the second heat spreader.

10. The method of claim 2, wherein the first die includes a first die active surface and a first die backside surface, the method further including:
forming a thermal interface material (TIM) in the first die recess; and
reflowing the TIM to bond the first die backside surface to the first die recess.

11. The method of claim 2, the method further including after placing the first die in the first die recess and before separating the first heat spreader and the second heat spreader, restraining the first die in the first die recess with a jig.

12. The method of claim 2, further including:
forming a first bumpless build-up layer (BBUL) that is coupled to the first die; and
forming a second BBUL that is coupled to the second die.

13. The method of claim 1, wherein separating the first heat spreader and the second heat spreader includes singulating the first heat spreader from an array of first heat spreaders, and singulating the second die heat spreader from an array of second heat spreaders.

14. A method comprising:
mating a first heat spreader and a second heat spreader, wherein the first heat spreader includes a first die recess and a first heat spreader mating surface, and wherein the second heat spreader includes a second die recess and a second heat spreader surface, and such that the first heat spreader mating surface and second hear spreader mating surface become parallel and adjacent;

placing a first die in the first die recess, wherein a first thermal interface material (TIM) is disposed between the first die and the first die recess;
placing a second die in the second die recess, wherein a second TIM is disposed between the second die and the second die recess;
reflowing the first TIM and the second TIM; and thereafter
separating the first heat spreader and the second heat spreader.

15. The method of claim 14 wherein the first die includes a first die active surface and a first die backside surface, wherein the second die includes a second die active surface and a second die backside surface, wherein placing the first die includes:
reflowing a first thermal interface material (TIM) between the first heat spreader first die recess and the first die backside surface, and wherein placing the second die includes:
reflowing a second TIM between the second hear spreader second die recess and the second die backside surface; and
wherein reflowing the first TIM and the second TIM cause respective first and second thermal stresses that substantially counteract.

16. The method of claim 14 wherein forming the first heat spreader is accomplished by a process selected from stamping the first heat spreader, machining the first heat spreader, or a combination thereof.

17. The method of claim 14 wherein mating includes fastening the first heat spreader to the second heat spreader.

18. The method of claim 14 the method further including after placing the first die in the first die recess and before separating the first heat spreader and the second heat spreader, restraining the first die in the first die recess with a jig.

19. The method of claim 14 further including:
forming a first bumpless build-up layer (BBUL) that is coupled to the first die; and
forming a second BBUL that is coupled to the second die.

20. The method of claim 14 wherein separating the first heat spreader and the second heat spreader includes singulating the first die heat spreader from an array of first heat spreaders, and singulating the second die heat spreader from an array of second heat spreaders.

21. A method comprising:
mating a first heat spreader and a second heat spreader, wherein the first heat spreader includes a first die recess and a first heat spreader mating surface, and wherein the second heat spreader includes a second die recess and a second heat spreader surface, and such that the first heat spreader mating surface and second heat spreader mating surface become parallel and adjacent;
thermal processing the first heat spreader and the second heat spreader; and thereafter
placing a first die in the first die recess, wherein the first die includes a first die active surface and a first die backside surface, wherein placing the first die includes reflowing a first thermal interface material (TIM) between the first heat spreader first die recess and the first die backside surface;
placing a second die in the second die recess, wherein the second die includes a second die active surface and a second die backside surface, and wherein placing the second die includes reflowing a second TIM between the second heat spreader second die recess and the second die backside surface; and wherein reflowing the first TIM and the second TIM cause respective first thermal stresses and second thermal stresses that substantially counteract each other; and separating the first heat spreader from the second heat spreader.

22. The method of claim 21, further including:

forming a first bumpless build-up layer (BBUL) that is coupled to the first die; and forming a second BBUL that is coupled to the second die.

23. The method of claim 21, further including:

forming the first heat spreader by stamping an array that includes the first die recess on a die side thereof and the first heat spreader mating surface on a heat sink side thereof; and forming the second heat spreader by stamping an array that includes the second die recess on a die side thereof and the second heat spreader mating surface on a heat sink side thereof.

* * * * *